US012719239B2

(12) United States Patent
Saito et al.

(10) Patent No.: US 12,719,239 B2
(45) Date of Patent: Aug. 25, 2026

(54) QUANTUM CASCADE ELEMENT

(71) Applicant: KABUSHIKI KAISHA TOSHIBA, Tokyo (JP)

(72) Inventors: Shinji Saito, Yokohama Kanagawa (JP); Rei Hashimoto, Edogawa Tokyo (JP); Kei Kaneko, Yokohama Kanagawa (JP); Tsutomu Kakuno, Fujisawa Kanagawa (JP)

(73) Assignee: KABUSHIKI KAISHA TOSHIBA, Kawasaki Kanagawa (JP)

( * ) Notice: Subject to any disclaimer, the term of this patent is extended or adjusted under 35 U.S.C. 154(b) by 873 days.

(21) Appl. No.: 17/976,590

(22) Filed: Oct. 28, 2022

(65) Prior Publication Data

US 2024/0146032 A1 May 2, 2024

(30) Foreign Application Priority Data

Dec. 21, 2021 (JP) ................................ 2021-207192

(51) Int. Cl.
*H01S 5/34* (2006.01)
*H01S 5/02* (2006.01)
(Continued)

(52) U.S. Cl.
CPC .......... *H01S 5/3401* (2013.01); *H01S 5/0215* (2013.01); *H01S 5/04253* (2019.08); *H01S 5/04256* (2019.08); *H01S 5/11* (2021.01)

(58) Field of Classification Search
CPC .. H01S 5/3401; H01S 5/0215; H01S 5/04253; H01S 5/04256; H01S 5/11
See application file for complete search history.

(56) References Cited

U.S. PATENT DOCUMENTS 4,738,935 A 4/1988 Shimbo et al.
7,206,488 B1 4/2007 Altug et al.
(Continued)

FOREIGN PATENT DOCUMENTS

JP S61-183915 A 8/1986
JP H10-284806 A 10/1998
(Continued)

OTHER PUBLICATIONS

Japan Patent Office, Office Action in JP App. No. 2021-207192 (Jun. 13, 2025).

(Continued)

*Primary Examiner* — Yuanda Zhang
(74) *Attorney, Agent, or Firm* — Finnegan, Henderson, Farabow, Garrett & Dunner, LLP

(57) ABSTRACT

A quantum cascade element includes a first substrate, a quantum cascade layer and a second substrate. The quantum cascade layer is provided at a front surface side of the first substrate. The quantum cascade layer includes a plurality of quantum well layers and a plurality of barrier layers alternately stacked in a direction perpendicular to the front surface of the first substrate. The second substrate is bonded to the first substrate with the quantum cascade layer interposed. The second substrate includes a photonic crystal contacting the quantum cascade layer. The photonic crystal includes a plurality of recesses at a side contacting the quantum cascade layer. The plurality of recesses faces an uppermost layer of the plurality of barrier layers.

16 Claims, 8 Drawing Sheets

(51) Int. Cl.
*H01S 5/042* (2006.01)
*H01S 5/11* (2021.01)

(56) References Cited

U.S. PATENT DOCUMENTS

| | | | | |
|---|---|---|---|---|
| 10,424,899 | B2 | 9/2019 | Saito et al. | |
| 11,114,821 | B2 | 9/2021 | Kaneko et al. | |
| 11,205,887 | B2 | 12/2021 | Hashimoto et al. | |
| 2006/0214176 | A1 | 9/2006 | Ouchi | |
| 2008/0240193 | A1 | 10/2008 | Noda et al. | |
| 2019/0074663 | A1* | 3/2019 | Saito | H01S 5/11 |
| 2019/0148915 | A1* | 5/2019 | Saito | H01S 5/3401 372/45.01 |
| 2019/0252856 | A1 | 8/2019 | Hirose et al. | |
| 2020/0028322 | A1 | 1/2020 | Noda et al. | |
| 2021/0091540 | A1 | 3/2021 | Saito et al. | |
| 2021/0399526 | A1* | 12/2021 | Hashimoto | H01S 5/04253 |
| 2023/0027967 | A1* | 1/2023 | Kaneko | H01S 5/187 |

FOREIGN PATENT DOCUMENTS

| | | | |
|---|---|---|---|
| JP | H11-186657 | A | 7/1999 |
| JP | 2005-159002 | A | 6/2005 |
| JP | 4187096 | B2 | 11/2008 |
| JP | 4250603 | B2 | 4/2009 |
| JP | 2009-231773 | A | 10/2009 |
| JP | 2018-41832 | A | 3/2018 |
| JP | 6513626 | B2 | 5/2019 |
| WO | WO 2018/159606 | A1 | 9/2018 |

OTHER PUBLICATIONS

Kei Kaneko et al., "Mid-IR surface-emitting Quantum Cascade Laser with Photonic Crystal," 27$^{th}$ IEEE Int. Semi. Laser Conf. (ISLC), 2 pages, DOI: 10.1109/ISLC51662.2021.9615821 (2021).

Susumu Noda et al., "Photonic Crystal Lasers and Related Functional Devices," 15$^{th}$ Annual Meeting O\of the IEEE Lasers and Electro-Optics Society, vol. 1, pp. 217-218, DOI: 10.1109/LEOS.2002.1134005 (2002).

* cited by examiner

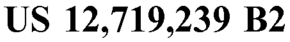
FIG. 4A
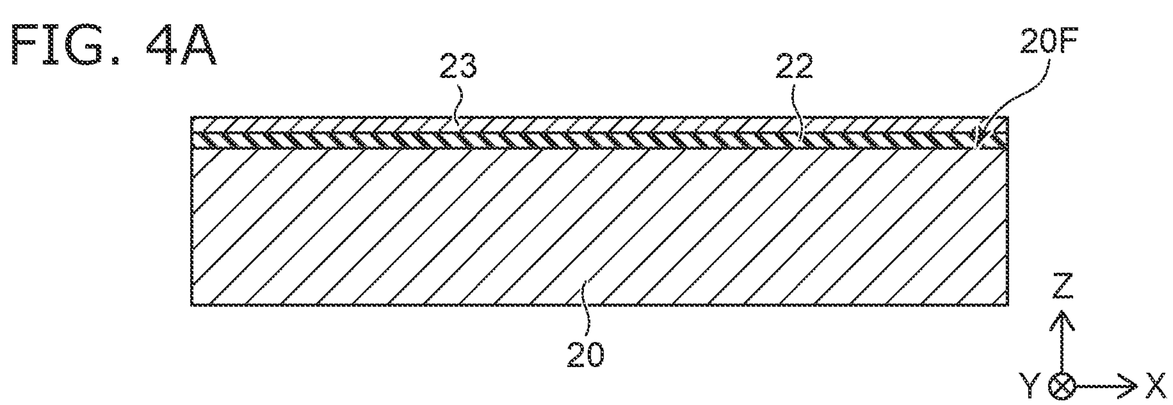
FIG. 4B
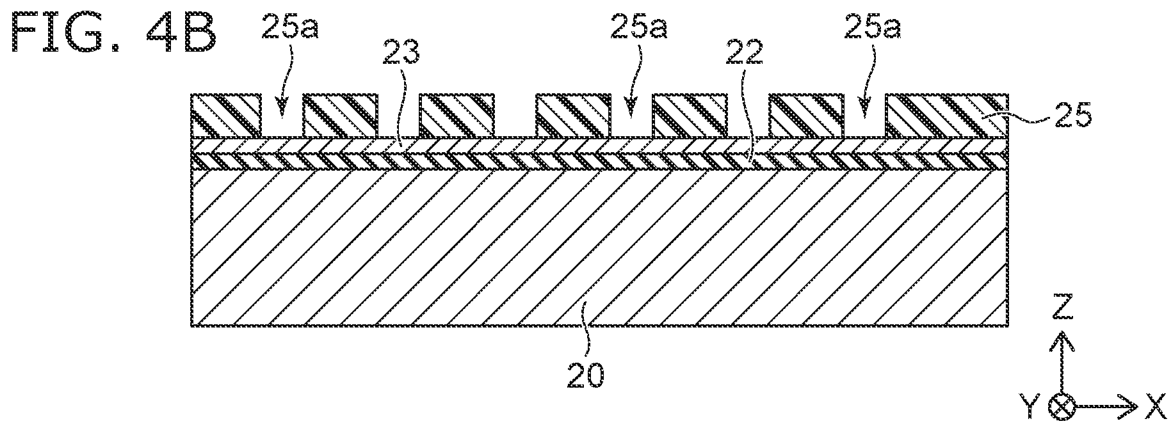
FIG. 4C
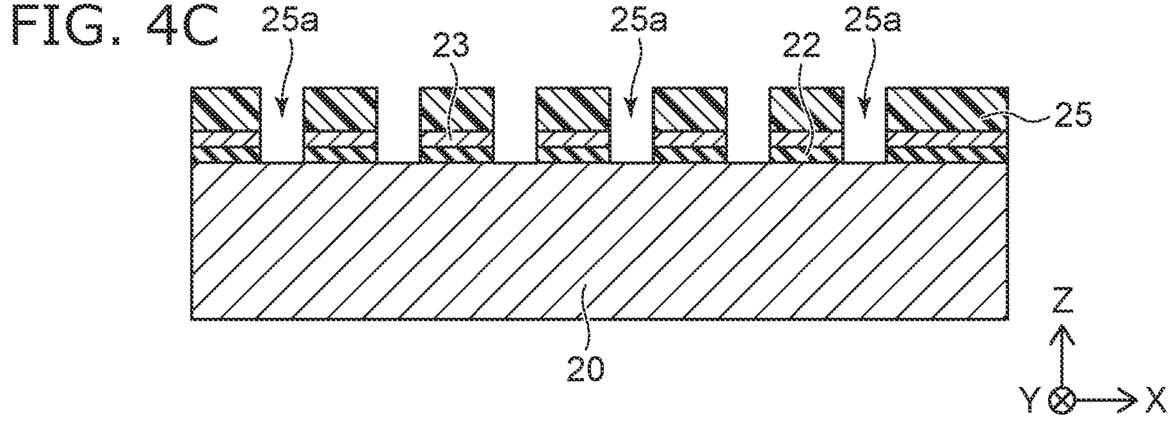
FIG. 4D
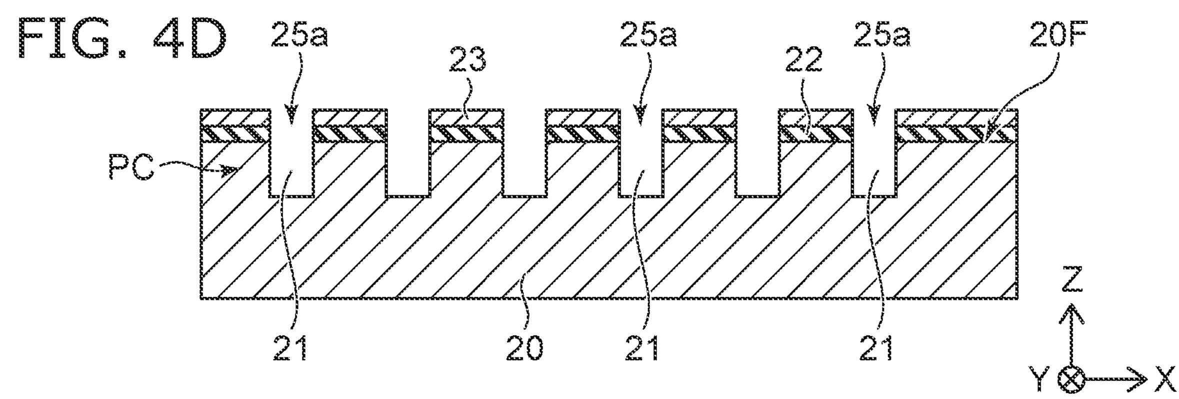

QUANTUM CASCADE ELEMENT

CROSS-REFERENCE TO RELATED APPLICATIONS

This application is based upon and claims the benefit of priority from Japanese Patent Application No. 2021-207192, filed on Dec. 21, 2021; the entire contents of which are incorporated herein by reference.

FIELD

Embodiments relate to a quantum cascade element.

BACKGROUND

Quantum cascade elements include such as a quantum cascade laser and a quantum cascade photodetector. Multiple quantum wells are used for the quantum cascade element, and exhibits a performance such as light emission and light detection due to an electron transition between energy bands. For example, a surface-emitting quantum cascade laser or a quantum cascade photodetector includes a quantum cascade layer, a photonic crystal, and a cladding layer, which are stacked in this order on a semiconductor substrate. The surface-emitting quantum cascade laser emits laser light in a direction perpendicular to a major surface of the substrate directed by the photonic crystal. The quantum cascade photodetector receives light incident in the direction perpendicular to the major surface of the substrate, and the quantum cascade layer convers the light to a photocurrent.

The photonic crystal changes a propagation direction of the laser light guided in the quantum cascade layer from a direction parallel to the major surface of the substrate to the direction perpendicular thereto. Further, a propagation direction of the incident light perpendicular to the major surface of the substrate is changed by the photonic crystal so that the light propagates along the quantum cascade layer. Therefore, the coupling efficiency between the photonic crystal and the light guided in the quantum cascade layer is preferably improved for increasing output power or sensitivity of the quantum cascade element.

BRIEF DESCRIPTION OF THE DRAWINGS

FIGS. 4A to 5B are schematic cross-sectional views showing a manufacturing process of the quantum cascade element according to the embodiment;

DETAILED DESCRIPTION

Figure 1A:
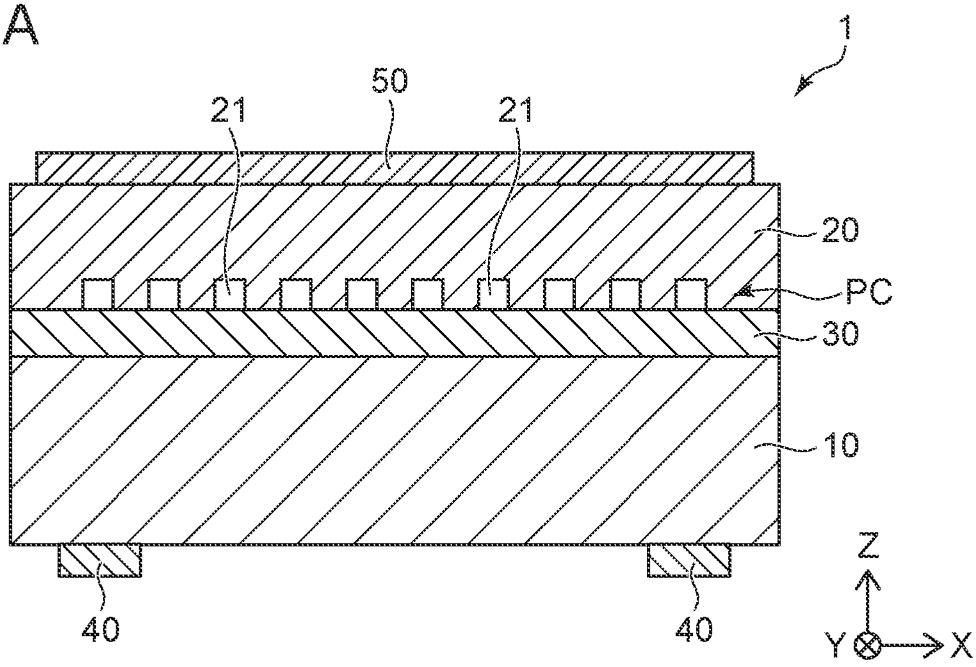
FIGS. 1A and 1B are schematic cross-sectional views showing a quantum cascade element according to an embodiment.

According to one embodiment, a quantum cascade element includes a first substrate, a quantum cascade layer and a second substrate. The quantum cascade layer is provided at a front surface side of the first substrate. The quantum cascade layer includes a plurality of quantum well layers and a plurality of barrier layers alternately stacked in a direction perpendicular to the front surface of the first substrate. The second substrate is bonded to the first substrate with the quantum cascade layer interposed. The second substrate includes a photonic crystal contacting the quantum cascade layer. The photonic crystal includes a plurality of recesses at a side contacting the quantum cascade layer. The plurality of recesses faces an uppermost layer of the plurality of barrier layers.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
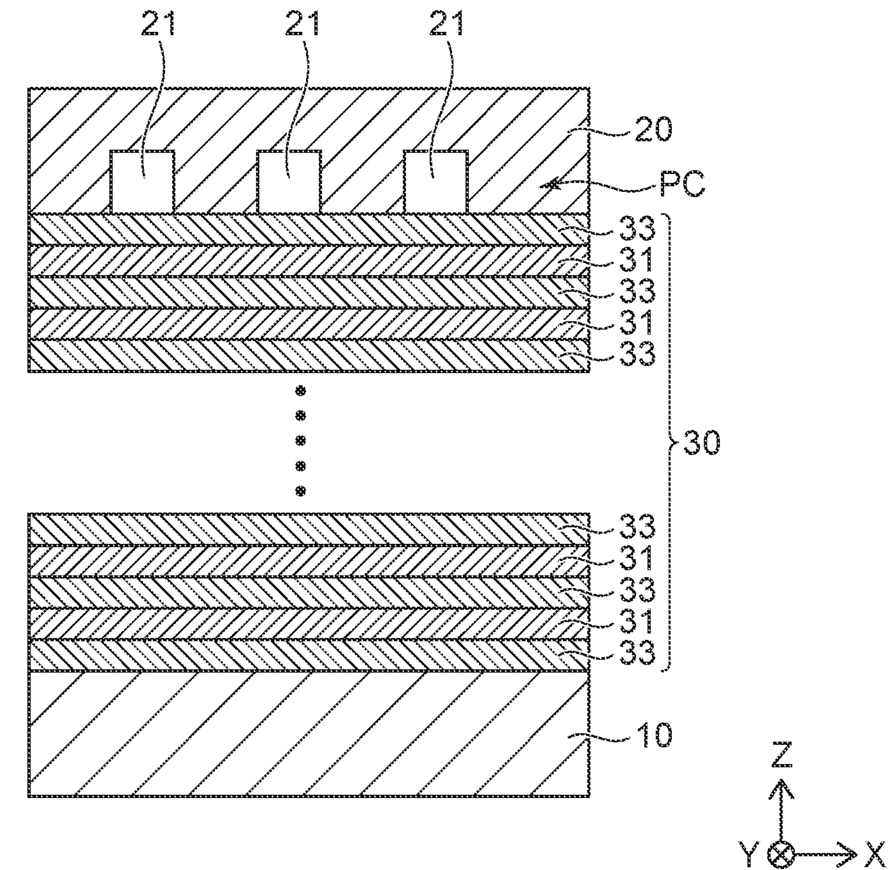

FIGS. 1A and 1B are schematic cross-sectional views showing a quantum cascade element 1 according to an embodiment. The quantum cascade element 1 is, for example, a surface-emitting quantum cascade laser. The quantum cascade element according to the embodiment is not limited to the following example. The quantum cascade element may be, for example, a quantum cascade photodetector.

As shown in FIG. 1A, the quantum cascade element 1 includes a first substrate 10, a second substrate 20, a quantum cascade layer 30, a first electrode 40, and a second electrode 50. The first substrate 10 is, for example, a semiconductor substrate including indium phosphide (InP) or the like. The second substrate 20 is, for example, a semiconductor substrate including InP, silicon, or the like. The quantum cascade layer 30 is provided between the first substrate 10 and the second substrate 20. The second substrate 20 is in contact with the quantum cascade layer 30.

The second substrate 20 includes a photonic crystal PC in contact with the quantum cascade layer 30. The photonic crystal PC is provided at a front surface side of the second substrate 20. The photonic crystal PC includes, for example, multiple recesses 21 provided in the front surface of the second substrate 20.

The first electrode 40 is provided, for example, on a back surface of the first substrate 10. The first electrode 40 is electrically connected to the quantum cascade layer 30 via the first substrate 10. The second electrode 50 is provided, for example, on a back surface of the second substrate 20. The back surface of the second substrate is provided at a side opposite to the photonic crystal PC. The second electrode 50 is electrically connected to the quantum cascade layer 30 via the second substrate 20.

FIG. 1B is a cross-sectional view showing the quantum cascade layer 30. The quantum cascade layer 30 includes multiple quantum-well layers 31 and multiple barrier layers 33. The quantum-well layers 31 and the barrier layers 33 are alternately stacked on the first substrate 10. The quantum well layer 31 is provided between the two barrier layers 33.

For example, the second substrate 20 is provided such that the photonic crystal PC is in contact with the uppermost layer of the multiple barrier layers 33. Thereby, it possible to improve a coupling efficiency between the photonic crystal PC and light propagating in the quantum cascade layer 30.

The quantum cascade element 1 is not limited to the example, and may further include, for example, another cladding layer or a buffer layer provided between the first substrate 10 and the quantum cascade layer 30.

Figure 2:
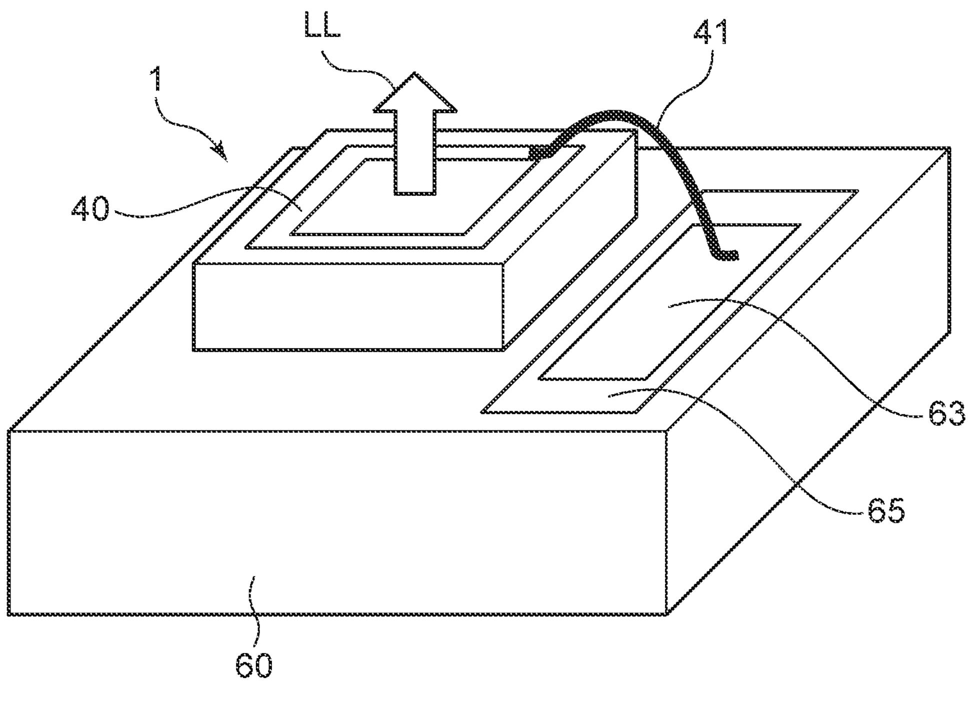
FIG. 2 is a schematic perspective view showing the quantum cascade element according to the embodiment.

FIG. 2 is a schematic perspective view showing the quantum cascade element 1 according to the embodiment. The quantum cascade element 1 is mounted, for example, on a heat sink 60. The heat sink 60 is, for example, a metal block including copper.

The quantum cascade element 1 is mounted such that the back surface of the first substrate 10 faces upward. The second electrode 50 provided at the back surface side of the second substrate 20 is connected to a mount pad (not shown) on the heat sink 60. The second electrode is connected to the heat sink 60 with, for example, a solder material interposed.

As shown in FIG. 2, the first electrode 40 is provided with a frame shape or a ring shape having an opening at which the back surface side of the first substrate 10 is exposed. Laser light LL emitted from the quantum cascade element 1 is radiated outward through the opening of the first electrode 40. The first electrode 40 surrounds a backside area of the first substrate 10 through which the laser light is radiated outward.

The first electrode 40 is electrically connected to a metal terminal 63 on the heat sink 60 via, for example, a metal wire 41. The metal terminal 63 is electrically insulated from the heat sink 60 by, for example, an insulating member 65. The quantum cascade element 1 is connected to an external drive circuit via the metal terminal 63 and the mount pad (not shown) on the heat sink 60.

Figure 3A:
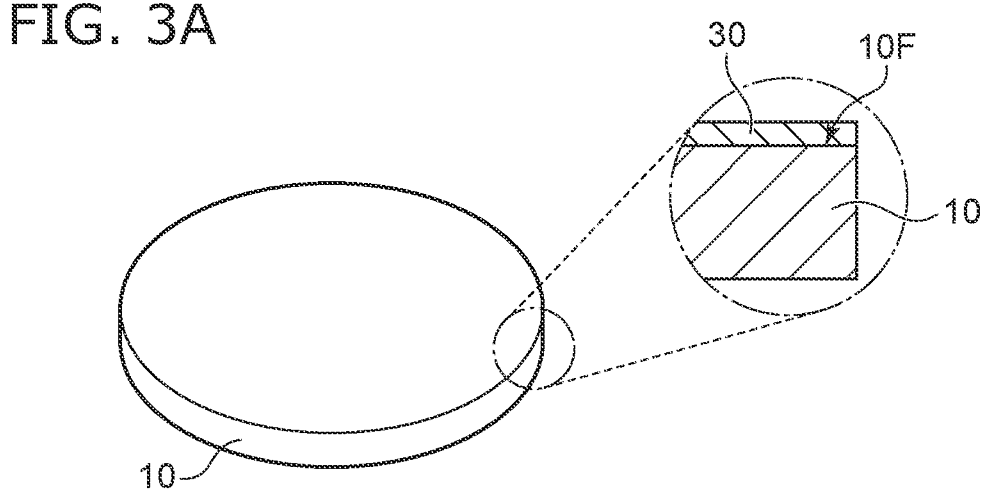
FIGS. 3A and 3B are perspective views schematically showing wafers used for manufacturing the quantum cascade element according to the embodiment.
Figure 3B:
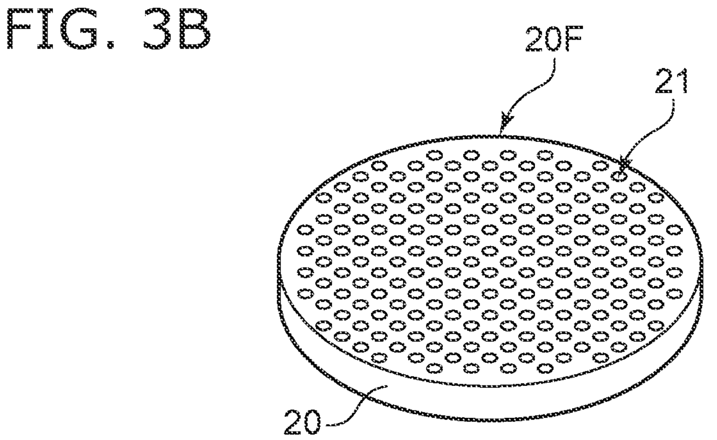

FIGS. 3A and 3B are perspective views schematically showing wafers used for manufacturing the quantum cascade element 1. The quantum cascade element 1 is formed by bonding the wafers shown in FIGS. 3A and 3B.

FIG. 3A is a schematic perspective view showing the first substrate 10 of the quantum cascade element according to the embodiment. As shown in FIG. 3A, the first substrate 10 includes the quantum cascade layer 30 provided on a front surface 10F thereof.

The quantum cascade layer 30 is formed on the first substrate 10 using, for example, molecular beam epitaxy (MBE). The first substrate 10 is a so-called growth substrate. For example, an InP substrate can be used as the first substrate 10.

The quantum cascade layer 30 includes the multiple quantum-well layers 31 and the multiple barrier layers 33 stacked in a direction perpendicular to the front surface 10F, for example, in the Z-direction. The quantum well layers 31 and the barrier layers 33 are alternately stacked to form multiple quantum wells.

The quantum well layer 31 includes, for example, a semiconductor mixed crystal InGaAs represented by a composition formula $In_XGa_{1-X}As$ (0<X<1). The barrier layer 33 includes, for example, another semiconductor mixed crystal InAlAs represented by a composition formula $In_YAl_{1-Y}As$ (0<Y<1).

Each of the multiple quantum wells includes subbands that are the quantized conduction energy band of the quantum-well layer 31. The quantum cascade element 1 emits laser light generated by inter-subband transition of electrons injected into the quantum cascade layer 30.

The multiple quantum wells include, for example, multiple first groups that serve as light-emitting quantum wells and multiple second groups that serve as injection quantum wells. The first groups and the second groups of the multiple quantum wells are alternately provided, for example, in the Z direction. The quantum cascade layer 30A has a thickness in the Z direction of, for example, 0.6 to 4 micrometers (μm).

FIG. 3B is a schematic perspective view showing the second substrate 20 of the quantum cascade element 1 according to the embodiment. As shown in FIG. 3B, the second substrate includes, for example, multiple recesses 21 formed on a front surface 20F thereof.

For example, the recesses 21 are arranged at equal intervals in an X-direction and a Y-direction. The recesses 21 are arranged to form a two-dimensional diffraction grating. The multiple recesses 21 are provided respectively at grating points of the two-dimensional diffraction grating. The recesses 21 each have, for example, a circular or right-triangular opening. The recesses 21 each have preferably an asymmetric shape with respect to an arrangement direction of the two-dimensional diffraction grating, for example, the X-direction or the Y-direction. The recesses 21 each are, for example, a cavity, and have a refractive index lower than a refractive index of a material of the second substrate 20. The inside of each recess 21 may be filled with a material having a refractive index lower than the refractive index of the material of the second substrate 20 at a wavelength of light emitted from the quantum cascade layer 30 or at a wavelength of light absorbed in the quantum cascade layer 30.

A method for manufacturing the quantum cascade element 1 is described below with reference to FIGS. 4A to 5B. FIGS. 4A to 5B are schematic cross-sectional views showing the manufacturing processes of the quantum cascade element 1 according to the embodiment.

As shown in FIG. 4A, a dielectric film 22 and a metal film 23 are formed on the front surface 20F of the second substrate 20. The second substrate 20 is, for example, an InP substrate. The dielectric film 22 is formed on the front surface 20F, and the metal film 23 is formed on the dielectric film 22.

The dielectric film 22 is, for example, a silicon nitride film or a silicon oxide film. The dielectric film 22 is formed using, for example, chemical vapor deposition (CVD), sputtering method, or electron cyclotron resonance (ECR). The dielectric film 22 has a thickness of, for example, 0.3 to 1 μm.

The metal film 23 is, for example, nickel (Ni). The metal film 23 is formed using, for example, a sputtering method. The metal film 23 has a film thickness of, for example, 100 nanometers (nm).

As shown in FIG. 4B, an etching mask 25 is formed on the metal film 23. The etching mask 25 is, for example, a photoresist. The etching mask 25 is applied on the metal film 23 and is exposed using a photomask having a mask pattern corresponding to the photonic crystal PC. Subsequently, the etching mask 25 is developed to form openings **25*a*** corresponding to the photonic crystal PC.

As shown in FIG. 4C, the metal film 23 and the dielectric film 22 are selectively removed using the etching mask 25, and the opening **25*a* corresponding to the photonic crystal PC is transferred. The metal film 23 and the dielectric film 22 are selectively removed by, for example, dry etching. Subsequently, the etching mask 25 is removed. The etching mask 25** is removed by, for example, oxygen ashing.

As shown in FIG. 4D, the second substrate 20 is etched through the opening 25*a* provided in the dielectric film 22 and the metal film 23 to form the recess 21. The second substrate 20 is selectively removed by, for example, dry etching.

Subsequently, the dielectric film 22 is removed from the front surface 20F of the second substrate 20 by wet etching. At this time, the metal film 23 is also removed together with the dielectric film 22. Accordingly, the photonic crystal PC including the multiple recesses 21 is formed at the front surface 20F side of the second substrate 20.

Figure 5A:
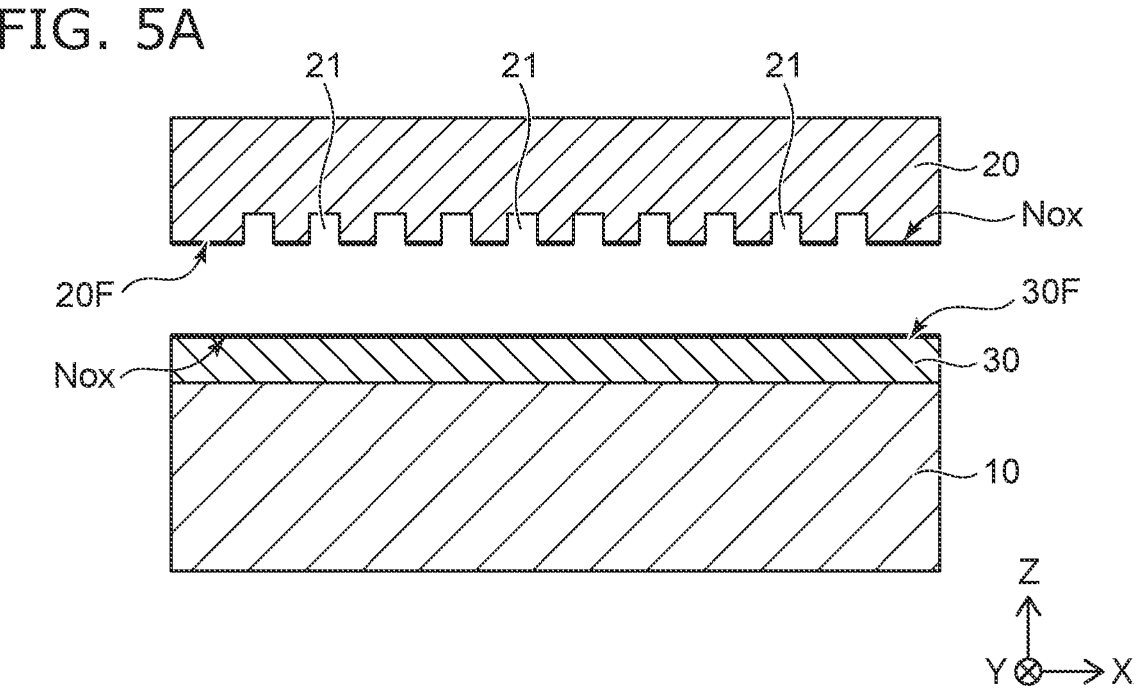

As shown in FIG. 5A, the first substrate 10 and the second substrate 20 are bonded to each other with the quantum cascade layer 30 interposed. The second substrate 20 is bonded so that the photonic crystal PC is in contact with the quantum cascade layer 30.

The front surface 20F of the second substrate 20 and a front surface 30F of the quantum cascade layer 30 are cleaned by, for example, argon (Ar) sputtering, and then the front surface 20F is brought into a surface contact with the front surface 30F. The first and second substrates 10 and 20 are heated under applying pressure thereto. The first substrate 10 and the second substrate 20 are heated up to, for example, 250° C. Thereby, the first substrate 10 and the second substrate 20 are bonded to each other with the quantum cascade layer 30 interposed.

The front surface 20F of the second substrate 20 and the front surface 30F of the quantum cascade layer 30 each include a natural oxide film Nox. The second substrate 20 and the quantum cascade layer 30 are preferably in surface-contact with each other so that at least a part of the natural oxide film Nox remains. That is, it is preferable to clean the front surface 20F of the second substrate 20 and the front surface 30F of the quantum cascade layer 30 so that at least a part of the natural oxide film Nox remains thereon. Thereby, it is possible to increase a bonding strength of the second substrate 20 and the quantum cascade layer 30 as compared with a case in which the natural oxide film Nox is not interposed therebetween. In other words, the bonding interface between the second substrate 20 and the quantum cascade layer 30 preferably contains oxygen.

Figure 5B:
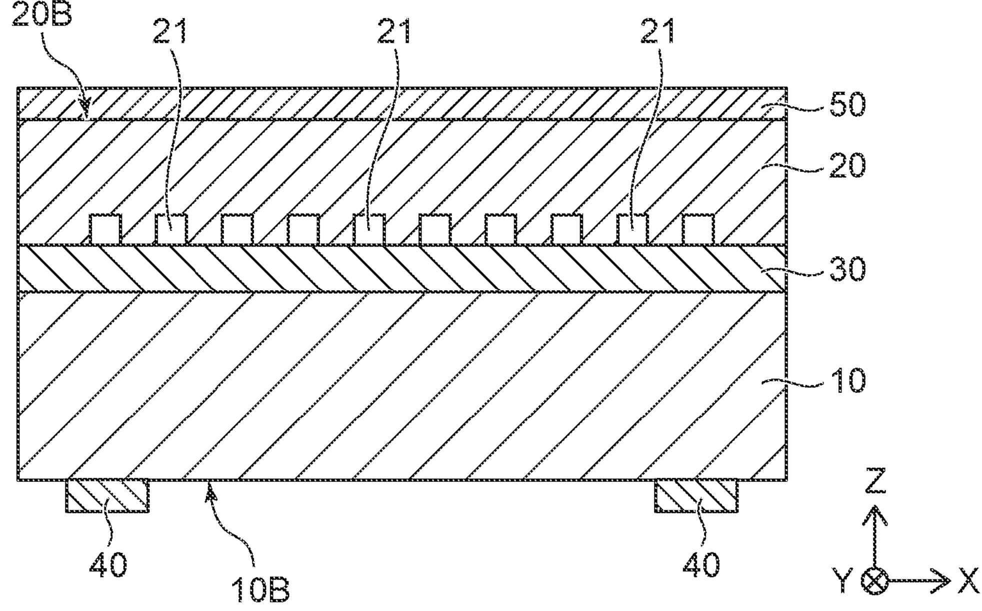

As shown in FIG. 5B, the first electrode 40 and the second electrode 50 are formed on a back surface 10B of the first substrate 10 and a back surface 20B of the second substrate 20, respectively. One of the first electrode 40 and the second electrode 50 has an opening in which an emission surface of the laser light LL is exposed.

Subsequently, the first substrate 10 and the second substrate 20 are cut by, for example, a dicing blade, and divided into multiple quantum cascade elements 1. The quantum cascade element 1 divided has a chip size of, for example, 500 μm square in a plan view.

As described above, in the quantum cascade element 1 according to the embodiment, the photonic crystal PC contacts the quantum cascade layer 30. Thereby, it is possible to improve the coupling efficiency between the photonic crystal PC and the light propagating in the quantum cascade layer 30 in a direction parallel to the front surface 30F. Thus, the quantum cascade element 1 can have the increased output. When the quantum cascade element 1 operates as a photodetector, the photonic crystal PC changes a propagation direction of incident light to propagate along the front surface of the quantum cascade layer 30. Thereby, it is possible to increase light absorption in the quantum cascade layer 30 and improve light detection sensitivity.

For example, it is difficult to form such a structure using manufacturing processes of forming the quantum cascade layer 30 on the first substrate 10 and further forming another semiconductor layer on the quantum cascade layer 30 by an epitaxial growth. In such a case, the photonic crystal PC is formed by, for example, etching the semiconductor layer formed on the quantum cascade layer 30. However, it is difficult to form the photonic crystal PC directly on the quantum cascade layer 30 without etching the quantum cascade layer 30 because a wafer includes non-uniformities of an epitaxial layer thickness, and an etching rate thereof varies depending on a position in the wafer surface. Therefore, to prevent a manufacturing yield from decreasing, such a quantum cascade element generally has a structure in which a photonic crystal is apart from a quantum cascade layer.

In the manufacturing method according to the embodiment, by bonding the first substrate 10 and the second substrate 20 with the quantum cascade layer 30 interposed, it is possible to achieve the structure in which the photonic crystal PC is provided directly on the quantum cascade layer 30.

On the other hand, the manufacturing method according to the embodiment, crystal defects may be inevitably generated due to a crystal discontinuity at the interface between the bonded wafers. Such crystal defects serve as, for example, carrier trap levels located in an energy bandgap, and increase non-radiative recombination of electrons and holes via the trap levels. Thus, the internal light emission efficiency is significantly reduced. That is, in the light emitting element using a radiative recombination of electrons and holes, it is difficult to provide the photonic crystal PC directly on a light-emitting layer using the wafer bonding.

In the quantum cascade element 1, the light emission is generated by the inter-subband transitions of electrons. Therefore, the carrier trap levels in the energy bandgap does not have little influence on the light emission characteristics. Thus, the wafer bonding can be used for providing the photonic crystal PC directly on the quantum cascade layer 30. That is, in the quantum cascade element according to the embodiment, it is possible to achieve the high output laser element or the high sensitive photodetector.

Further, it is possible to improve the uniformity of electron injection into the quantum cascade layer 30 by the interface containing oxygen provided between the quantum cascade layer 30 and the photonic crystal PC. That is, the presence of oxygen increases an electrical resistance of the bonding interface, and enhances the electron injection widely into the quantum cascade layer 30 including portions facing the recesses 21 of the photonic crystal PC. Thereby, it is possible to improve the light emission efficiency in the quantum cascade layer 30.

Figure 6:
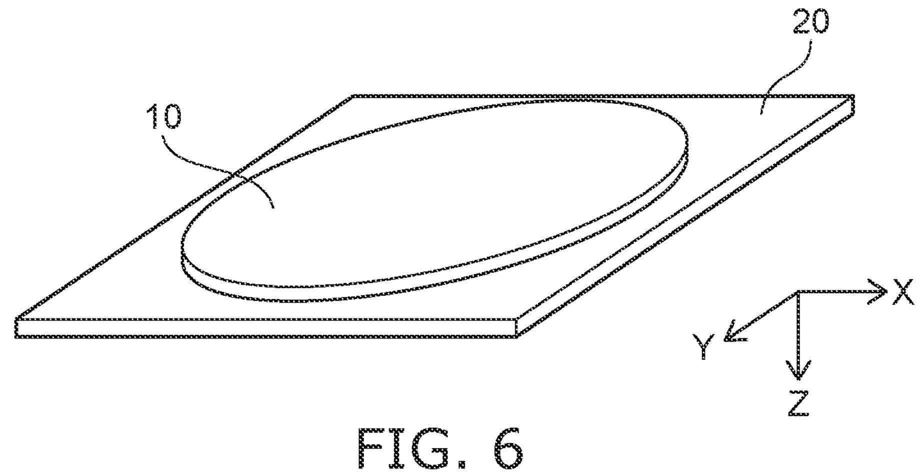
FIG. 6 is a schematic perspective view showing a method for manufacturing the quantum cascade element according to a variation of the embodiment.

FIG. 6 is a schematic perspective view showing a method for manufacturing the quantum cascade element 1 according to a variation of the embodiment. The second substrate 20 may be a semiconductor substrate other than the InP substrate or a dielectric substrate. The second substrate 20 is, for example, a silicon substrate.

As shown in FIG. 6, the first substrate 10 and the second substrate 20 are bonded to each other with the quantum cascade layer 30 (not shown) interposed. The second substrate 20 is, for example, a silicon substrate. The second substrate 20 is provided by cutting, for example, a silicon wafer having a diameter of 300 millimeters (mm). The photonic crystal PC is formed in the second substrate 20.

Subsequently, the second substrate 20 is thinned to a predetermined thickness by, for example, wet etching at a back surface side of the second substrate 20. Then, the first electrode 40 and the second electrode 50 are formed on the back surface sides of the first substrate 10 and the second substrate 20, respectively.

As described above, the use of the silicon wafer facilitates a manufacturing process and improves the processing accuracy of the photonic crystal PC. Moreover, the silicon wafer is less expensive than other substrates, and reduce a manufacturing cost of the quantum cascade element.

In the manufacturing method including the steps of forming the semiconductor layer on the quantum cascade layer by the crystal-growth and forming the photonic crystal in the semiconductor layer, when a defective wafer is found in the process of forming the photonic crystal or the subsequent process, the defective wafer includes the quantum cascade layer, and thus, the manufacturing loss is expensive. In the manufacturing method according to the embodiment, such a loss can be minimized.

Figure 7A:
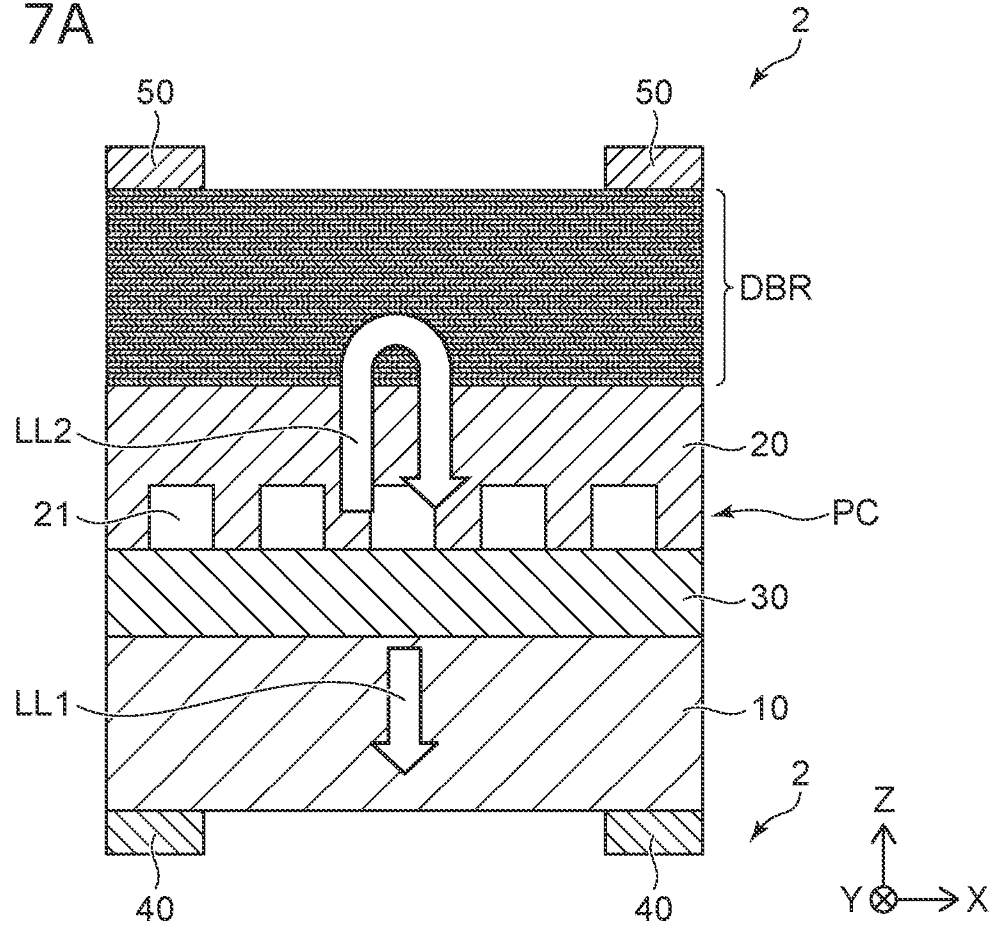
FIGS. 7A and 7B are schematic cross-sectional views showing quantum cascade elements according to variations of the embodiment.
Figure 7B:
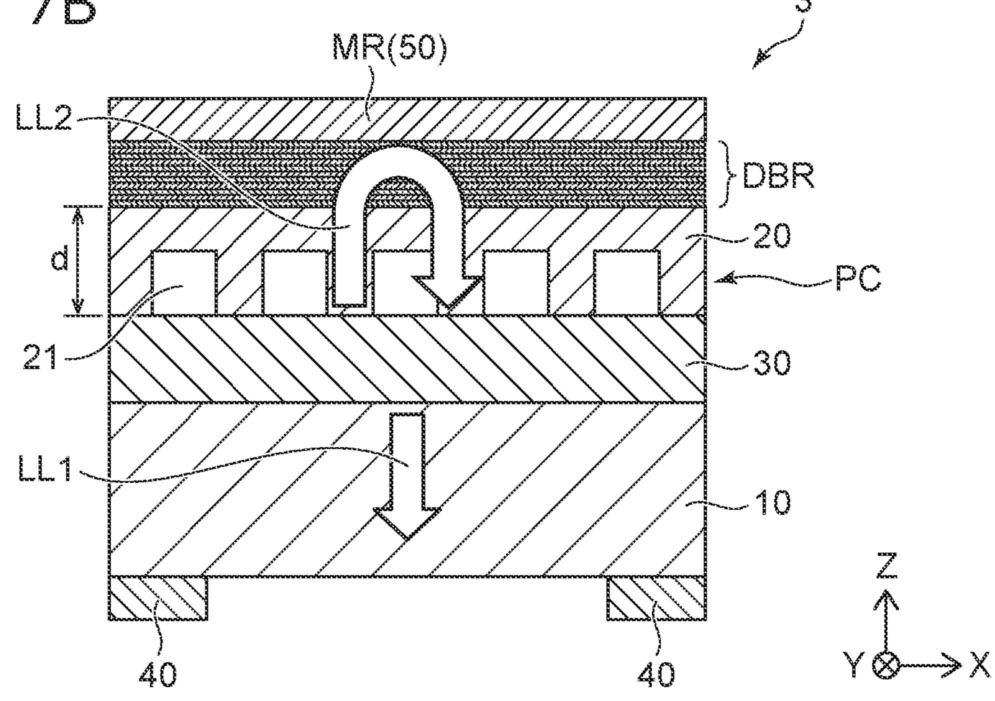

FIGS. 7A and 7B are schematic cross-sectional views showing quantum cascade elements 2 and 3 according to variations of the embodiment. Each of the quantum cascade elements 2 and 3 includes a Distributed Bragg reflector (DBR) of multi-films.

As shown in FIG. 7A, the quantum cascade element 2 further includes the DBR provided on the back surface of the second substrate 20. The photonic crystal PC is provided on a front surface of the second substrate 20 opposite to the back surface. The DBR reflects, for example, the laser light LL2 emitted from the quantum cascade layer 30 toward the second substrate 20 so that the laser light LL2 propagates toward the first substrate 10. Thereby, it is possible to improve the extracting efficiency of the laser light LL through the back surface of the first substrate 10.

As shown in FIG. 7B, the quantum cascade dement 3 further includes the DBR and a metal film MR on the back surface side of the second substrate 20. The metal film MR is provided on the DBR. The metal film MR includes, for example, a material such as gold (Au) that has a high reflectance for the laser light. The metal film MR has, for example, a stacked structure including a nickel layer of 5 nm thickness and a gold layer of 1 μm thickness.

The DBR is provided between the second substrate 20 and the metal film MR. The metal film MR improves a reflectance for the laser light LL2 emitted from the quantum cascade layer 30, and further improves the extracting efficiency of the laser light LL through the back surface of the first substrate 10. The metal film MR also serves as, for example, the second electrode 50.

The DBR is, for example, a semiconductor multilayer film. The DBR is, for example, the semiconductor multilayer film in which InP layers and InGaAs layers are alternately stacked. The InP layer has a layer thickness of, for example, 364 nm. The InGaAs layer has a layer thickness of, for example, 331 nm. The DBR includes, for example, 20 pairs of the InP layer and the InGaAs layer, and serves as a reflective mirror for the laser light having a wavelength of 4.5 μm. The semiconductor multilayer film has, for example, conductivity. The semiconductor multilayer film may be polycrystal. That is, the semiconductor multilayer film includes crystal defects and the like that have no influence on the characteristics of the quantum cascade elements 2 and 3.

A pair of ZnSe/ZnS, Si/SiGe, GaAs/AlAs or the like can also be used as a material of the DBR. Such materials are formed using, for example, crystal growth method or the sputtering method. Each layer thickness in the DBR is, for example, λ/4Neff. Here, "λ" is a wavelength of the laser light, and "Neff" is an effective refractive index of each layer in the DBR at the laser light wavelength.

A distance between the DBR and the quantum cascade layer 30 is preferably provided such that the laser light LL1 emitted from the quantum cascade layer 30 and directly propagating toward the first substrate 10 and the laser light LL2 reflected by the DBR and propagating toward the first substrate 10 are not canceled by, for example, interference. Thereby, it is possible to further improve the efficiency of extracting the laser light LL.

A distance from the bonding interface between the quantum cascade layer 30 and the photonic crystal PC to the DBR, i.e., a thickness d of the second substrate 20 in a stacking direction (e.g., the Z-direction) is preferably expressed by the following equation.

$$d=dact/2+(\lambda/Nseff)\times M$$

Figure 8:
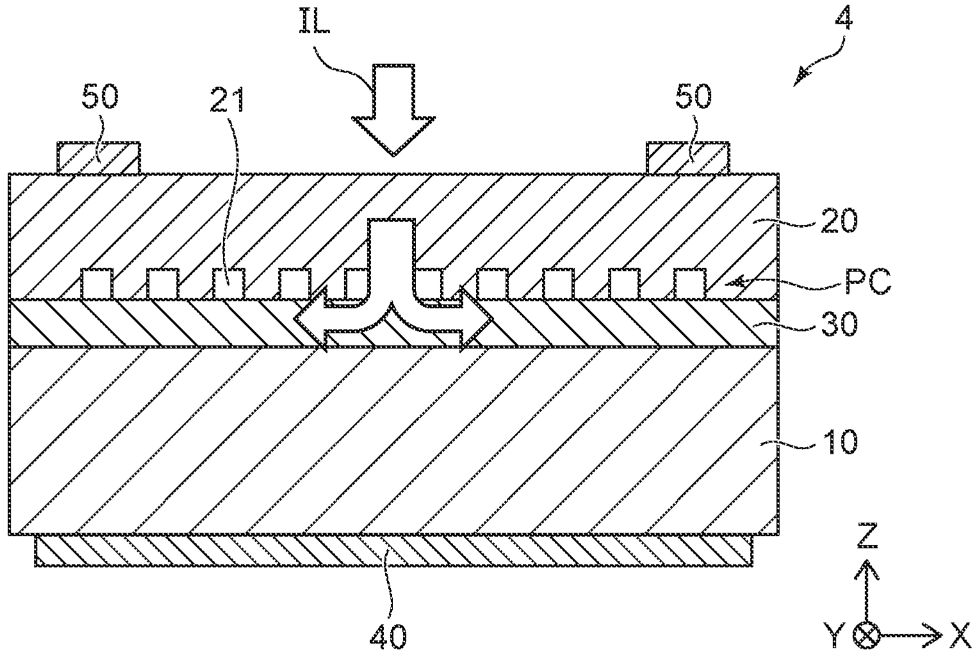
FIG. 8 is a schematic cross-sectional view showing a quantum cascade element according to another variation of the embodiment.

Here, "dart" is a thickness in the stacking direction of the quantum cascade layer 30, "λ" is a wavelength of the laser light LL, "Nseff" is an effective refractive index of the material of the second substrate 20 at the wavelength of the laser light LL, and M is any integer, FIG. 8 is a schematic cross-sectional view showing a quantum cascade element 4 according to another variation of the embodiment. The quantum cascade element 4 is, for example, a photodetector. The quantum cascade element 4 detects, for example, a variation of a current value due to an incident light IL entered through the back surface of the second substrate 20 while applying a predetermined voltage between the first electrode 40 and the second electrode 50. The second electrode 50 is provided outside an area of the second substrate 20 where the incident light enters. The second electrode 50 surrounds, for example, the light incident area.

Infrared light is detected in the quantum cascade layer 30 by, for example, the inter-subband transition of electrons, but the light absorption coefficient thereof is small. Therefore, it is preferable in the quantum cascade element 4 to elongate a propagation distance of the incident light in the quantum cascade layer 30, and thereby, increase photosensitivity. That is, the quantum cascade element 4 is preferably configured to increase the photosensitivity such that the incident light propagates inside the quantum cascade layer 30 in a direction parallel to the front surface of the first substrate 10.

For example, the incident light may propagate in the direction parallel to the front surface of the first substrate 10 when the incident light enters the quantum cascade layer 30 through a side surface thereof. The quantum cascade layer 30, however, has a thickness of, for example, 2 to 5 μm in the stacking direction (e.g., the Z-direction). Therefore, it is difficult to align the incident light on the side surface of the quantum cascade layer 30.

In contrast, in the quantum cascade element 4 according to the embodiment, the photonic crystal PC is provided to change the propagation direction of the incident light IL. The photonic crystal PC changes the propagation direction of the incident light IL from the incident direction crossing the back surface of the second substrate 20 to a direction parallel to the front surface of the first substrate 10. Therefore, the precise alignment of the incident light IL on the side surface of the quantum cascade layer 30 is unnecessary, and the light detection sensitivity can be improved. Moreover, the light receiving sensitivity is further improved by the photonic crystal PC contacting the quantum cascade layer 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A quantum cascade element comprising:

a first substrate;

a quantum cascade layer provided at a front surface side of the first substrate, the quantum cascade layer including a plurality of quantum well layers and a plurality of barrier layers alternately stacked in a direction perpendicular to the front surface of the first substrate; and a second substrate bonded to the first substrate with the quantum cascade layer interposed, the second substrate including a photonic crystal contacting the quantum cascade layer, the photonic crystal including a plurality of recesses at a side contacting the quantum cascade layer, the plurality of recesses facing an uppermost layer of the plurality of barrier layers;

an oxide film provided between the quantum cascade layer and the photonic crystal, the oxide film directly contacting the quantum cascade layer and the photonic crystal, wherein each recess of the photonic crystal includes a side face extending along the direction perpendicular to the front surface of the first substrate, and no oxide film is provided on the side face.

2. The element according to claim 1, wherein the plurality of recesses each are a cavity.

3. The element according to claim 1, wherein the second substrate includes a first material, and the plurality of recesses is filled with a second material having a refractive index lower than a refractive index of the first material at a wavelength of light emitted from the quantum cascade layer or at a wavelength of light absorbed in the quantum cascade layer.

4. The element according to claim 1, wherein an interface between the quantum cascade layer and the photonic crystal contains oxygen.

5. The element according to claim 1, further comprising:

electrodes providing a driving current flowing through the quantum cascade layer, the quantum cascade layer emitting light by inter-subband transition of carries.

6. The element according to claim 5, wherein the electrodes include a first electrode provided on the first substrate and a second electrode provided on the second substrate, the first substrate being provided between the first electrode and the quantum cascade layer, the second substrate being provided between the second electrode and the quantum cascade layer, the first electrode surrounds an area of the first substrate, the light emitted from the quantum cascade layer being radiated outside through the area of the first substrate, and the second electrode contains a material reflecting the light emitted from the quantum cascade layer.

7. The element according to claim 5, further comprising:

a reflection layer including multiple films stacked on the second substrate, the second substrate being provided between the quantum cascade layer and the reflection layer.

8. The element according to claim 7, wherein the reflection layer is conductive.

9. The element according to claim 7, wherein the reflection layer includes two kinds of semiconductor films alternately stacked.

10. The element according to claim 7, further comprising:

a metal film provided on the reflection layer, the metal film reflecting the light emitted from the quantum cascade layer, the reflection layer being provided between the second substrate and the metal film.

11. The element according to claim 1, further comprising:

electrodes provided on the first and second substrate, respectively, a photocurrent generated in the quantum cascade layer by an incident light flowing through the electrodes.

12. The element according to claim 11, wherein the electrodes include a first electrode provided on the first substrate and a second electrode provided on the second substrate, the first substrate being provided between the first electrode and the quantum cascade layer, the second substrate being provided between the second electrode and the quantum cascade layer, and the second electrode is provided outside an area of the second substrate, the incident light entering the quantum cascade layer through the area of the second substrate.

13. The element according to claim 1, wherein the second substrate contains at least one of silicon, gallium arsenide, zinc selenide, sapphire, and indium phosphide.

14. The element according to claim 1, wherein the first substrate contains a material different from a material of the second substrate.

15. The element according to claim 1, wherein the first substrate contains a material same as a material of the second substrate.

16. The element according to claim 1, wherein the first substrate includes indium phosphide, and the second substrate includes silicon.

* * * * *